(12) United States Patent
Ng et al.

(10) Patent No.: US 7,353,347 B2
(45) Date of Patent: Apr. 1, 2008

(54) RECONFIGURABLE STATE MACHINE

(75) Inventors: Fuk Ho Pius Ng, Plano, TX (US); Y. Paul Chiang, Richardson, TX (US)

(73) Assignee: MathStar, Inc., Minneapolis, MN (US)

( * ) Notice: Subject to any disclaimer, the term of this patent is extended or adjusted under 35 U.S.C. 154(b) by 554 days.

(21) Appl. No.: 10/947,877

(22) Filed: Sep. 23, 2004

(65) Prior Publication Data
US 2006/0062036 A1    Mar. 23, 2006

(51) Int. Cl.
    *G06F 12/00*     (2006.01)
    *G06F 7/38*     (2006.01)
    *G11C 15/00*     (2006.01)

(52) U.S. Cl. .................. 711/156; 711/108; 365/49; 326/46

(58) Field of Classification Search .......... None
See application file for complete search history.

(56) References Cited

U.S. PATENT DOCUMENTS 5,905,902 A * 5/1999 O'Connor ............... 712/1
7,173,452 B2 * 2/2007 Folsom ............... 326/46
2006/0221658 A1 * 10/2006 Gould et al. ............. 365/49

OTHER PUBLICATIONS

S.A. Guccione, D. Levi and D. Downs, "A Reconfigurable Content Addressable Memory", International Parallel and Distributed Processing Symposium 2000, May 1, 2000. Cancun, Mexico. pp. 1-8.

* cited by examiner

*Primary Examiner*—Denise Tran
(74) *Attorney, Agent, or Firm*—Westman, Champlin & Kelly

(57) ABSTRACT

A reconfigurable state machine is provided. The state machine includes a current state register, for storing a current state, and at least one programmable state entry per state of the state machine. Each programmable entry includes a plurality of external signal inputs, a current state tag, at least one next state condition, and a respective next state output. A next state match circuit compares the current state with the current state tag and compares each of the next state conditions with at least one of the external signal inputs to produce a next state match output.

20 Claims, 1 Drawing Sheet

RECONFIGURABLE STATE MACHINE

FIELD OF THE INVENTION

The present invention relates to logical circuits and more particularly to a reconfigurable state machine for use on an integrated circuit, for example.

BACKGROUND OF THE INVENTION

State machines are essential elements of most digital circuits. A state machine has a set of states and a transition function, which transitions from state to state based on a set of input conditions. There are many types of state machines, such as finite state machines, state machines having outputs associated with transitions, state machines having outputs associated with states, deterministic state machines and nondeterministic state machines. Such state machines are common in all computer and integrated circuits applications.

Typically, state machines are custom designed for each application. Also, these state machines are typically optimized in terms of area and power consumption. The design of the state machines can therefore become quite complex and can involve time-consuming simulations in order to verify operation. As transistor densities on integrated circuits continue to increase, the development complexity, time and cost associated with designing and verifying state machines become high. In order to reduce development complexity, time and cost, a reconfigurable platform is desired, which would provide a flexible and effective architecture for implementing state machines in a natural way with a minimal learning curve. Such a platform would preferably be capable of providing a cost effective-implementation for a large number of state machines having a wide variety of configurations and functions.

SUMMARY OF THE INVENTION

One embodiment of the present invention is directed to a reconfigurable state machine. The state machine includes a current state register, for storing a current state, and at least one programmable state entry per state of the state machine. Each programmable entry includes a plurality of external signal inputs, a current state tag corresponding to the respective state of the state machine, at least one next state condition associated with the current state tag, and a respective next state output for each of the next state conditions in the respective entry. A next state match circuit compares the current state with the current state tag and each of the next state conditions with at least one of the external signal inputs to produce a next state match output.

Another embodiment of the present invention is directed to a reconfigurable state machine comprising a current state register for storing a current state and at least one programmable state entry per state of the state machine. Each programmable state entry is implemented as a contents addressable memory element. The element includes a plurality of external signal inputs, a tag section for storing a current state tag and at least one next state condition, a data section for storing a respective next state output for each of the next state conditions in the tag section, and a next state match circuit. The next state match circuit compares the current state with the current state tag and compares the next state conditions with at least one of the external signal inputs.

Another embodiment of the present invention is directed to a reconfigurable state machine. The state machine includes an external signal input, a current state register, for storing a current state, and a programmable state entry for each state of the state machine. Each programmable state entry includes a circuit for comparing the current state with a current state tag and the external signal inputs with at least one next state condition, and for outputting a next state value to the current state register if a match occurs.

Another embodiment of the present invention is directed to a method of configuring a state machine. The method includes: (a) providing a programmable state entry for each state of the state machine, wherein each programmable state entry comprises a current state tag register, at least one next state condition register, and at least one corresponding next state output register; (b) loading the current state tag register of each state entry with a corresponding current state tag; (c) loading each next state condition register with a corresponding next state condition; and (d) loading each next state output register with a corresponding next state output value.

DETAILED DESCRIPTION OF THE PREFERRED EMBODIMENTS

Figure 1:
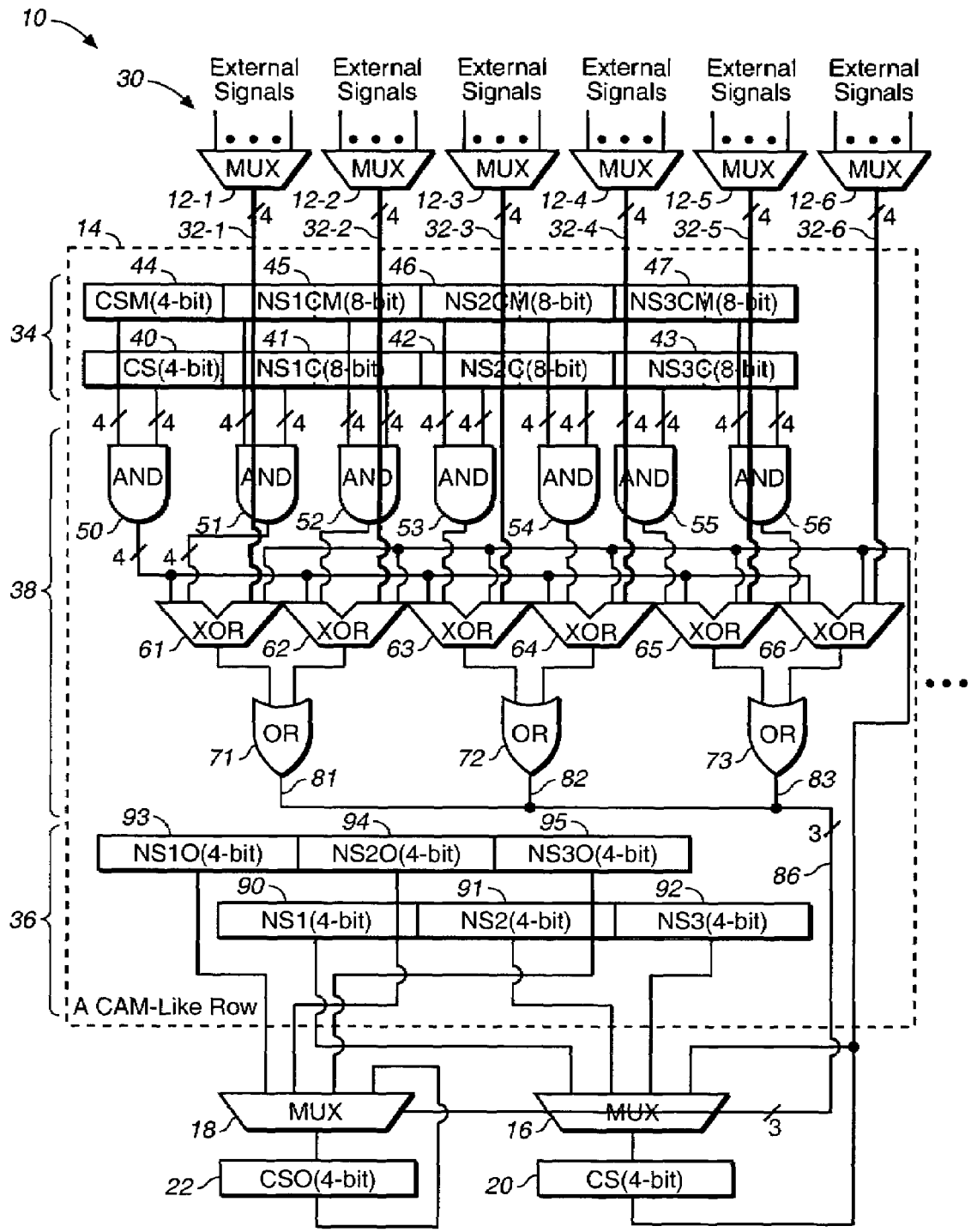
FIG. 1 is a block diagram illustrating a reconfigurable state machine according to one embodiment of the present invention.

A state machine can be characterized by the number of states, the number of transitions per state, the number of input and output control signals, and other required logic such as counters for assisting the next state control logic. During development of the present invention, the inventors performed a general survey to determine the characteristics of state machines across a wide range of applications, technical fields and design organizations. The statistics shown in Table 1 were collected manually from published papers, standards and Internet resources.

TABLE 1

| Applic | Functions | #states | Count reset as a transition | | | Consider reset as a feature | | | Global | Cntr | Ctrl Sigs |
|---|---|---|---|---|---|---|---|---|---|---|---|
| | | | #trans | ave | max | #trans | ave | max | | | |
| SPI-4.2 | Analysing In Status Seq. | 4 | 11 | 2.75 | 4 | 9 | 2.25 | 3 | 1 | 3 | 8 |
| (Jennic) | In Channel Error Processing | 4 | 14 | 3.50 | 5 | 11 | 2.75 | 4 | 1 | 0 | 4 |
| | In Interface Processing | 10 | 35 | 3.50 | 5 | 26 | 2.60 | 4 | 1 | 2 | 11 |
| | SPI-4.2 Datapath SD | 5 | 18 | 3.60 | 5 | 13 | 2.60 | 4 | 1 | 2 | 5 |
| RapidIO | InPort Retry Recovery | 4 | 12 | 3.00 | 4 | 9 | 2.25 | 3 | 1 | 0 | 5 |
| | OutPort Retry Recovery | 4 | 12 | 3.00 | 4 | 9 | 2.25 | 3 | 1 | 0 | 4 |

TABLE 1-continued

| Applic | Functions | #states | Count reset as a transition | | | Consider reset as a feature | | | Global | Cntr | Ctrl Sigs |
|---|---|---|---|---|---|---|---|---|---|---|---|
| | | | #trans | ave | max | #trans | ave | max | | | |
| | InPort Error Recovery | 4 | 12 | 3.00 | 4 | 9 | 2.25 | 3 | 1 | 0 | 4 |
| | OutPort Error Recovery | 5 | 16 | 3.20 | 4 | 12 | 3.00 | 3 | 1 | 0 | 6 |
| | InPort Training | 5 | 18 | 3.60 | 5 | 14 | 2.80 | 4 | 1 | 1 | 8 |
| | OutPort Training | 7 | 22 | 3.14 | 5 | 16 | 3.20 | 4 | 1 | 1 | 10 |
| PCI Express | Link Training and Status | 11 | 27 | 2.45 | 5 | 20 | 1.82 | 4 | 5 | | |
| | Sub –> Detect | 3 | 7 | 2.33 | 3 | 4 | 1.33 | 2 | 0 | 1 | 3 |
| | Sub –> Polling | 5 | 14 | 2.80 | 4 | 9 | 1.80 | 3 | 0 | 3 | 8 |
| | Sub –> Config | 2 | 6 | 3.00 | 3 | 4 | 2.00 | 2 | 0 | 0 | 4 |
| | Sub –> Recovery | 3 | 11 | 3.67 | 4 | 8 | 2.67 | 3 | 0 | 1 | 5 |
| | Sub –> L0 | 6 | 13 | 2.17 | 3 | 7 | 1.17 | 2 | 0 | 0 | 4 |
| | Sub –> L1 | 2 | 4 | 2.00 | 2 | 2 | 1.00 | 1 | 0 | 0 | 2 |
| | Sub –> L2 | 3 | 8 | 2.67 | 3 | 5 | 1.67 | 2 | 0 | 0 | 4 |
| | Sub –> Loopback | 3 | 8 | 2.67 | 3 | 4 | 1.33 | 2 | 0 | 1 | 2 |
| | Link Power Management | 6 | 14 | 2.33 | 4 | 9 | 1.50 | 3 | | | |
| | PME Control | 4 | 11 | 2.75 | 4 | 8 | 2.00 | 3 | 1 | 0 | 8 |
| Ethernet | Transmit State Machine | 7 | 18 | 2.57 | 4 | 12 | 1.71 | 3 | 2 | 0 | 4 |
| | Receive State Machine | 3 | 9 | 3.00 | 4 | 7 | 2.33 | 3 | 1 | 0 | 4 |
| USB Cntrl | Operating Modes SM | 7 | 16 | 2.29 | 5 | 10 | 1.43 | 4 | 1 | 0 | 5 |
| | Transmit | 6 | 17 | 2.83 | 4 | 11 | 1.83 | 3 | 1 | 0 | 5 |
| | Receive | 10 | 30 | 3.00 | 5 | 20 | 2.00 | 4 | 1 | 0 | 6 |
| 1284 Parallel Port | Simplified Mode Transition | 11 | 34 | 3.09 | 7 | 24 | 2.18 | 6 | 1 | 0 | 14 |
| | Reverse Idle Phase | 6 | 16 | 2.67 | 4 | 10 | 1.67 | 3 | 1 | 0 | 3 |
| Lattice SDRAM | Master SM(ispLSI 2128E) | 6 | 26 | 4.33 | 6 | 21 | 3.50 | 5 | 1 | 2 | 8 |
| TI EDRAM | | 7 | 22 | 3.14 | 5 | 15 | 2.14 | 4 | 1 | 1 | 3 |
| Time Warner Cable | Lightweight Stream Control | 6 | 27 | 4.50 | 5 | 21 | 3.50 | 4 | 1 | 0 | 6 |
| | Protocol Equivalent SM | 4 | 21 | 5.25 | 6 | 17 | 4.25 | 5 | 1 | 0 | 6 |
| PPP | Opening a PPP Link | 6 | 22 | 3.67 | 5 | 16 | 2.67 | 4 | 1 | 0 | 5 |
| Motorola-SPS | Transmitter | 6 | 13 | 2.17 | 4 | 8 | 1.33 | 3 | 1 | 0 | 7 |
| FCC-HDLC | Receiver | 6 | 15 | 2.50 | 4 | 9 | 1.50 | 3 | 1 | 1 | 7 |
| VOIP (H. 323) | Answer Inbound Call | 6 | 15 | 2.50 | 4 | 9 | 1.50 | 3 | 1 | 0 | 9 |
| CDMA | Convolution Code (2, 1, 3) Enc | 4 | 12 | 3.00 | 3 | 8 | 2.00 | 2 | 1 | 0 | 2 |
| | Dynamic Code Assignment | 11 | 27 | 2.45 | 9 | 18 | 1.64 | 8 | 1 | 0 | 11 |
| Digital Broadband Delivery Sys | Ranging and Calibration | 6 | 18 | 3.00 | 5 | 13 | 2.17 | 4 | 1 | 1 | 5 |
| TIRIS | Control | 10 | 37 | 3.70 | 5 | 27 | 2.70 | 4 | 1 | 2 | 8 |
| Overall | | 5.7 | 17.2 | 3.02 | 4.4 | 12.1 | 2.157 | 3.4 | | | 5.575 |

The first two columns in Table 1 provide the application and the function of each state machine considered in the survey. The third column provides the number of states in each state machine, excluding reset.

The following six columns are divided into two groups. The first group, columns 4-6, considers a global reset as a separate implicit state transition. The second group, columns 7-9, considers that there is hardware support in the state machine to reset the current state to the default reset state. Thus, the implicit reset state transition is not counted. Each group contains the total number of state transitions, the average number of transitions per state, and the maximum number of transitions per state. A state transition is any outbound state transition arc in a representative state diagram. The average number of transitions per state is the number of state transitions divided by the number of states. The tenth column provides the number of global signals, which are either reset signals or inbound signals having no originating state. The number of counters for each function is provided in column 11. Some state machine applications require counter functions. For example in the SPI-4.2 application, counters are required for counting 8n cycles in an SPI4 payload or for counting ten cycles for an SPI4 training sequence.

The last column provides the number of unique control signals required for all of the state transitions. The definition of a unique control signal that was used for generating Table 1 is any logic AND function of a set of signals. If a state transition is triggered by a logic OR function of two sets of signals that are logically ANDed within each set, then this is counted as two separate state transitions for that state as well as two separate control signals. In fact, this minterm type of control signal for a state transition is quite common. Two other common state transitions include a self-transition and an unconditional transition to the next state. These types of transitions are not shown separately in Table 1.

The data shown in Table 1 reveals an intriguing conformity of all the state machines considered in the survey even though the state machines came from a wide range of technical fields and design organizations. Assuming that the reset signals are supported by hardware, the data shown in Table 1 reveals that 90% of the state machines have at least one state with four transitions. Over 80% of the fourth transitions for these states are a self-transition. The average number of state transitions is 2.157. Over 90% of the state machines have three or less transitions per state. Although the average number of control signals is 5.575, an optimal number of control signals that satisfies the greatest number of applications is 11, which covers 97% of the cases. Finally, although the number of states for the PCI Express Controller is 38, it appears that 85% of the state machines have seven states or less.

Table 2 shows the coverage of state machines in the survey based on the number of external control signals. The first column lists the number of control signals, and the second column lists the percentage of state machines considered in the survey that have less than or equal to the number of control signals listed in the first column.

TABLE 2

| # Ctrl Signals | Coverage of State Machines |
| --- | --- |
| 1 | 0% |
| 2 | 8% |
| 3 | 16% |
| 4 | 37% |
| 5 | 55% |
| 6 | 66% |
| 7 | 71% |
| 8 | 87% |
| 9 | 89% |
| 10 | 92% |
| 11 | 97% |
| 12 | 97% |
| 13 | 97% |
| 14 | 100% |

The data shown in Tables 1 and 2, illustrates that although state machines have a wide variety of functions and implementations, these state machines have many common characteristics. A reconfigurable platform is therefore desired, which is capable of providing a cost effective implementation of a wide variety of state machines, such as many of those shown in Table 1.

FIG. 1 is a block diagram illustrating a reconfigurable state machine 10 according to one embodiment of the present invention. In example shown in FIG. 1, reconfigurable state machine 10 has a scaleable architecture that is able to satisfy 85% to 90% to the state machine applications shown in Table 1. However, state machine 10 can be modified to implement many other state machine applications. These modifications can include, for example, the number of inputs and outputs, the number of states, the number of transitions per state, the number of input and output control signals, and can be modified to include or exclude other logic such as counters to assist next state transitions.

Referring to FIG. 1, reconfigurable state machine 10 includes a set of input multiplexers 12-1 through 12-6, at least one programmable state entry 14 for each state in the state machine, global output multiplexers 16 and 18, a global current state register 20 and a global decoded current state output register 22. Current state register 20 stores a state value, which is updated by the state entries 14 to reflect the current state of state machine 10.

State machine 10 has a plurality of states, and one or more next state transitions per state. A next state transition is any outbound state transition arc in a representative state diagram. A transition from one state to the next is triggered by one or more external signals 30 under conditions set by the corresponding state entry 14 for the current state of state machine 10. In order to provide flexibility in the external signals that trigger a state transition, groups of one or more of the external signals 30 are multiplexed by input multiplexers 12-1 through 12-6. In the embodiment shown in FIG. 1, six groups of eight external signals are multiplexed into six subgroups of four signals onto 4-bit control inputs 32-1 through 32-6. As described in more detail below, control inputs 32-1 and 32-2 trigger a transition from a current state to a first next state, subgroups 32-3 and 32-4 trigger a transition from the current state to a second next state, and subgroups 32-5 and 32-6 trigger a transition from the current state to a third next state.

In the embodiment shown in FIG. 1, state entry 14 has a structure similar to a contents addressable memory (CAM) element, with a tag section 34, a data section 36 and a next state match logic circuit 38. Tag section 34 includes a plurality of programmable registers, including a 4-bit current state tag register 40, next state condition registers 41-43, a current state mask register 44, and next state condition mask registers 45-47.

Current state tag register 40 is loaded with a 4-bit current state tag CS, which is associated with state entry 14. Next state condition registers 41-43 are loaded with 8-bit next state conditions NS1C, and NS2C and NS3C, which define the conditions under which state machine 10 transitions from the state corresponding to the current state tag in register 40 to one of three next states NS1, NS2 or NS3, respectively. The next state conditions NS1C, NS2C and NS3C represent the outbound state transition arcs for the state loaded in state tag register 40.

Mask register 44 can be loaded with a 4-bit mask word, which allows selected bits in current state tag register 40 to be masked when determining whether the current state of state machine 10 in register 20 corresponds to the current state tag loaded in register 40. Next state condition mask registers 45-47 can be loaded with 8-bit mask words NS1CM, NS2CM and NS3CM, which allow selected bits in next state conditions NS1C, NS2C and NS3C to be masked when determining whether the selected external signals 30 on control inputs 32-1 through 32-6 satisfy the conditions for transitioning from the current state to one of the next states NS1, NS2 or NS3.

This bit-wise mask operation is performed by logic AND gates 50-56 within next state match logic 38. AND gate 50 logically ANDs the four bits of the current state tag in register 40 with the 4-bit mask in mask register 44 to produce a 4-bit masked current state tag. The 8-bit next state conditions NS1C, NS2C and NS3C are each divided into two groups of four bits in order to allow a transition to a next state upon the satisfaction of one condition or another, defined by the two groups of four bits. This implements a common minterm that occurs in most state machine transfer functions. AND gates 51-56 logically AND respective 4-bit groups the next state conditions in registers 41-43 with corresponding 4-bit groups in mask registers 45-47 to produce respective 4-bit masked next state conditions.

Next state match logic 38 further includes six exclusive-OR (XOR) gates 61-66 for comparing the actual current state of state machine 10 (stored in register 20) with the masked current state tag and for comparing each of the masked next state conditions NS1C, NS2C and NS3C with corresponding groups external signals 30 applied by multiplexers 12-1 through 12-6. XOR gates 61-66 are divided into three groups of two XOR gates, one group of two XOR gates for each next state condition.

For example, XOR gates 61 and 62 compare respective 4-bit groups of masked next state condition NS1C with the selected groups of four external signals 30 provided by multiplexers 12-1 and 12-2. XOR gate 61 has a first set of compare inputs coupled to the current state tag 40 (as masked by AND gate 50) and to a first four bits of next state condition NS1C, as masked by AND gate 51. XOR gate 61 has a second set of compare inputs coupled to the actual current state of state machine 10 (stored in register 20) and to a corresponding set of the external signals 30 provided by multiplexer 12-1.

Similarly, XOR gate 62 has a first set of compare inputs coupled to the current state tag 40 (as masked by AND gate 50) and to a second four bits of next state condition NS1C, as masked by AND gate 53. XOR gate 62 has a second set of compare inputs coupled to the actual current state of state machine 10 (stored in register 20) and to a corresponding set of the external signals 30 provided by multiplexer 12-2.

Logic OR gate 71 combines the outputs of XOR gates 61 and 62. Thus, if the current state of state machine 10 matches the current state tag stored in register 40 and if either the external signals selected by multiplexer 12-1 match the first four bits of masked next state condition NS1C or the external signals selected by multiplexer 12-2 match the second four bits of masked next state condition NS1C, the output of logic OR gate will indicate a match or "hit" on match output 81. Otherwise, OR gate 71 will indicate a "no match" on match output 81.

XOR gates 63-66 operate in a similar fashion for comparing corresponding subgroups external signals to masked subgroups of next state conditions NS2C and NS3C. Logic OR gate 72 combines the outputs of XOR gates 63 and 64, and logic OR gate 73 combines the outputs of XOR gates 65 and 66. Logic OR gates 72 and 73 have match outputs 82 and 83, respectively.

Therefore, for each next state condition NS1C, NS2C and NS3C, match logic 38 includes a logic OR gate 71, 72 and 73, respectively, for determining whether there is a match of any 4-bit subgroup of the next state conditions. Logic OR gates 71-73 implement common minterms in typical state machine functions. If the corresponding subgroups of external signals match either of the 4-bit subgroups of a corresponding next state condition, the respective logic OR gate 71, 72 or 73 will indicate a match on its output. The outputs of OR gates 71-73 have four possible combinations, a match of next state condition NS1C, a match of next state condition NS2C, a match of next state condition of NS3C or no match of any one of the next state conditions. The combined outputs of logic OR gates 71-73 provide a 3-bit next state match output 86, which can be used by multiplexers 16 and 18 for selecting an appropriate next state for state machine 10.

Data section 36 includes a plurality of programmable registers, including 4-bit next state registers 90, 91, 92 and 4-bit decoded next state registers 93, 94 and 95. Next state registers 90-92 are loaded with values that represent next states NS1 and NS2 and NS3. Next states NS1, NS2 and NS3 correspond to the three possible next states to which state machine 10 can transition from the state indicated by current state tag 40 when one of the next state conditions NS1C, NS2C, or NS3C is satisfied.

Next state registers 90-92 are coupled to three of the data inputs to multiplexer 16. A fourth data input to multiplexer 16 is coupled to the output of global current state register 20. The select inputs to multiplexer 16 are coupled to the 3-bit next state match output 86, which select whether NS1, NS2, NS2 or the current state will be loaded into current state register 20. If a match occurs, multiplexer 16 couples the corresponding next state register 90-92 to current state register 20. If no match occurs, multiplexer 16 feeds the current state back to current state register 20, thereby implementing a "self-transition."

In some embodiments, it may be beneficial for each state entry 14 to provide decoded next state control outputs such that a separate decoder is not required to decode the current state in register 20. The decoded values of next state NS1, NS2 and NS3 are loaded into registers 93-95. The outputs of registers 93-95 are coupled to respective inputs of multiplexer 18. Another input to multiplexer 18 is coupled to the output of decoded current state output register 22. Based on the next state match output 86 provided by state entry 14, multiplexer 18 couples one of the decoded next state outputs or the decoded current state to register 22.

In order to implement a reset transition, current state register 20 and decoded current state register 22 are provided with one-bit control signals (not shown) to provide a conditional reset of the current state values of state machine 10.

The input multiplexers 12-1 through 12-6 and the state entry 14 shown in FIG. 1 can be replicated for each state of state machine 10. The current state CS in global state register 20 is compared against the current state tags of all entries 14 simultaneously. In one embodiment, the data outputs of all entries 14 are wire-ORed to combine respective outputs at the inputs of multiplexers 16 and 16 in a similar fashion as memory bitlines. For example, the outputs of each NS1 register are wired together, the outputs of each NS2 register are wired together, and so on. The outputs from state entries not having a "hit" can be disabled or programmed to output a "0". The respective next state match output bits 81-83 from all state entries 14 can also be wire-ORed together. Thus, only the entry having a hit would drive the wire-OR junctions.

Alternatively, a hierarchy of multiplexers can be used to multiplex the outputs to registers 20 and 22 based on the next state match outputs 86 from all of the entries 14. If there is no hit in any of the entries 14, registers 20 and 22 maintain their current values.

In certain applications, a particular state in state machine 10 may have more than three possible next states. These states can be implemented with more than one state entry 14. For example, if a state has six possible next states, state machine 10 would have two entries 14 for that state. One entry 14 would be loaded with a current state tag 40 that corresponds to that state and with three of the six next state conditions. The other entry 14 would be loaded with the same current state tag 40 and the three other next state conditions. The actual current state of the state machine is compared against the current state tags of the entire table of entries 14, including these two entries. Again, the corresponding outputs of all entries can be wire-ORed together to combine outputs.

The structure and method shown in FIG. 1 can be used to implement a wide variety of state machines by simply instantiating an appropriate number of state entries 14 and loading appropriate values into registers 40-47 and 90-95. For example, a 16-entry reconfigurable state machine can be built, which could be configured to implement all of the state machines in table one except the PCI Express, thereby providing close to 90 percent coverage of these state machines. In one embodiment, the effectiveness of the reconfigurable state machine engine can be improved by allowing the 16-entry state machine to behave as two independent 8-entry state machine engines. Such a state machine engine can be reconfigured loading different values into tag section 34 and data section 36.

The structure and method shown in FIG. 1 provide a flexible and effective architecture for implementing state machines in a natural way with a minimal learning curve. This reduces development complexity, time and cost, of implementing reconfigurable platforms.

Although the present invention has been described with reference to preferred embodiments, workers skilled in the art will recognize that changes may be made in form and detail without departing from the spirit and scope of the invention.

What is claimed is:

1. A reconfigurable state machine comprising a current state register, for storing a current state, and at least one programmable entry per state of the state machine, wherein each programmable entry comprises:
   a plurality of external signal inputs;
   a current state tag corresponding to the respective state of the state machine;
   at least one next state condition associated with the current state tag;
   a respective next state output for each of the next state conditions in the respective entry;
   a next state match circuit, which compares the current state with the current state tag and each of the next state conditions with at least one of the external signal inputs to produce a next state match output; and
   for each next state condition in the programmable entry:
      an input control multiplexer, which multiplexes a set of the plurality external input signals into a subset of the external input signals, wherein the subset is applied to the next state match circuit for comparison with the corresponding next state condition.

2. The reconfigurable state machine of claim 1 wherein each programmable entry is configured as a contents addressable memory element, wherein the current state tag and each associated next state condition are stored in a programmable register forming a tag section of the corresponding entry, and the respective next state outputs are stored in a programmable data register forming a data section of the contents addressable memory element.

3. The reconfigurable state machine of claim 1 wherein each entry further comprises:
   a current state tag mask, wherein the current state tag is masked by the current state tag mask.

4. The reconfigurable state machine of claim 1 wherein each entry further comprises:
   a next state condition mask for each respective next state condition, wherein each next state condition is masked by the respective next state condition mask.

5. The reconfigurable state machine of claim 2 wherein each entry further comprises:
   a decoded next state register, for each of the next state conditions in the respective entry, which stores a decoded version of the respective next state output.

6. The reconfigurable state machine of claim 1 wherein the next state outputs of the entry are multiplexed into the current state register as a function of the next state match output.

7. The reconfigurable state machine of claim 6 wherein corresponding ones of the next state outputs from all of the entries in the state machine are logically wire-ORed with one another.

8. The reconfigurable state machine of claim 1 wherein the next state match circuit comprises, for each next state condition:
   an exclusive-OR circuit having a first set of compare inputs coupled to the current state tag and the associated next state condition and a second set of compare inputs coupled to the current state register and a corresponding set of the external signal inputs.

9. The reconfigurable state machine of claim 8 wherein:
   each next state condition comprises first and second condition fields;
   the corresponding set of external signal inputs comprises first and second subsets of external signal inputs;
   the exclusive-OR circuit comprises:
      a first exclusive-OR circuit, which compares the current state tag and the first condition field of the associated next state condition with the current state register and the first subset of the external signal inputs; and
      a second exclusive-OR circuit, which compares the current state tag and the second condition field of the associated next state condition with the current state register and the second subset of the external signal inputs; and
   the match circuit comprises, for each next state condition, a logic OR circuit, which generates the next state match output from outputs of the first and second exclusive-OR circuits.

10. The reconfigurable state machine of claim 1 wherein the state machine comprises a set of two or more of the programmable entries for at least one of the states, wherein each entry in the set comprises the same current state tag, different next state conditions for different next states and different respective next state outputs than the other entries in the set.

11. A reconfigurable state machine comprising a current state register, for storing a current state, and at least one programmable state entry per state of the state machine, wherein each programmable state entry is implemented as a contents addressable memory element, comprising:
   a plurality of external signal inputs;
   a tag section for storing a current state tag and at least one next state condition;
   a data section for storing a respective next state output for each of the next state conditions in the tag section;
   a next state match circuit, which compares the current state with the current state tag and compares the next state conditions with at least one of the external signal inputs; and
   for each next state condition in the programmable state entry:
      an input control multiplexer, which multiplexes a set of the plurality external signal inputs into a subset of the external signal inputs, wherein the subset is applied to the next state match circuit for comparison with the corresponding next state condition.

12. The reconfigurable state machine of claim 11 wherein the tag section further comprises:
   a current state tag mask, wherein the current state tag is masked by the current state tag mask.

13. The reconfigurable state machine of claim 11 wherein the tag section further comprises:
   a next state condition mask for each next state condition, wherein each next state condition in the tag section is masked by the respective next state condition mask.

14. The reconfigurable state machine of claim 11 wherein the data section further comprises:
   a decoded next state output register, for each of the next state outputs stored in the data section, which stores a decoded version of the respective next state output.

15. The reconfigurable state machine of claim 11 wherein the next state outputs of the entry are multiplexed into the current state register as a function of a next state match output produced by the next state match circuit.

16. The reconfigurable state machine of claim 15 wherein corresponding bits of the next state outputs from all of the state entries in the state machine are logically wire-ORed with one another.

17. The reconfigurable state machine of claim 11 wherein the next state match circuit comprises, for each next state condition:
an exclusive-OR circuit having a first set of compare inputs coupled to the current state tag and an associated one of the next state conditions and a second set of compare inputs coupled to the current state register and a corresponding set of the external signal inputs.

18. The reconfigurable state machine of claim 11 wherein the state machine comprises a set of two or more of the programmable state entries for at least one of the states, wherein each state entry in the set comprises the same current state tag, different next state conditions for different next states and different respective next state outputs than the other entries in the set.

19. A method of configuring a state machine, the method comprising:
providing a programmable state entry for each state of the state machine, wherein each programmable state entry comprises a current state tag register, at least one next state condition register, and at least one corresponding next state output register;
loading the current state tag register of each state entry with a corresponding current state tag;
loading each next state condition register with a corresponding next state condition;
loading each next state output register with a corresponding next state output value;
for each of the next state conditions, multiplexing a set of a plurality external signal inputs into a subset of the external signal inputs for comparison with the corresponding next state condition comparing a current state with the current state tag and each of the next conditions with the subset of the external signal inputs to produce a next state match output.

20. A reconfigurable state machine comprising a current state register, for storing a current state, and at least one programmable entry per state of the state machine, wherein each programmable entry comprises:
a plurality of external signal inputs;
a current state tag corresponding to the respective state of the state machine;
at least one next state condition associated with the current state tag;
a respective next state output for each of the next state conditions in the respective entry;
a next state match circuit, which compares the current state with the current state tag and each of the next state conditions with a corresponding set of the external signal inputs to produce a next state match output;
wherein each next state condition comprises first and second condition fields;
wherein the corresponding set of external signal inputs comprises first and second subsets of external signal inputs;
wherein the next state match circuit comprises, for each next state condition:
a first exclusive-OR circuit, which compares the current state tag and the first condition field of the associated next state condition with the current state register and the first subset of the external signal inputs; and
a second exclusive-OR circuit, which compares the current state tag and the second condition field of the associated next state condition with the current state register and the second subset of the external signal inputs; and
wherein the match circuit comprises, for each next state condition, a logic OR circuit, which generates the next state match output from outputs of the first and second exclusive-OR circuits.

* * * * *

UNITED STATES PATENT AND TRADEMARK OFFICE
CERTIFICATE OF CORRECTION

PATENT NO. : 7,353,347 B2
APPLICATION NO. : 10/947877
DATED : April 1, 2008
INVENTOR(S) : Ng et al.

Page 1 of 1

It is certified that error appears in the above-identified patent and that said Letters Patent is hereby corrected as shown below:

<u>Column 11</u>

Line 36, please insert -- ; and -- after "next state condition" and begin a new paragraph with "comparing a current state".

Signed and Sealed this

Thirtieth Day of September, 2008

JON W. DUDAS
*Director of the United States Patent and Trademark Office*